(12) United States Patent
Genz et al.

(10) Patent No.: US 11,412,631 B2
(45) Date of Patent: Aug. 9, 2022

(54) PCB WITH INTEGRATED SWITCHES

(71) Applicant: Snap-on Incorporated, Kenosha, WI (US)

(72) Inventors: Jason Genz, Greendale, WI (US); Michael T. Rajzer, Greendale, WI (US); Craig Brouwers, Racine, WI (US); Joshua M. Beer, Mount Pleasant, WI (US)

(73) Assignee: Snap-on Incorporated, Kenosha, WI (US)

( * ) Notice: Subject to any disclaimer, the term of this patent is extended or adjusted under 35 U.S.C. 154(b) by 0 days.

(21) Appl. No.: 17/003,440

(22) Filed: Aug. 26, 2020

(65) Prior Publication Data

US 2022/0071041 A1    Mar. 3, 2022

(51) Int. Cl.
| | |
|---|---|
| *H05K 5/00* | (2006.01) |
| *H05K 7/14* | (2006.01) |
| *B25F 5/02* | (2006.01) |
| *B25B 21/00* | (2006.01) |
| *H02K 11/00* | (2016.01) |

(52) U.S. Cl.
CPC ......... *H05K 7/1427* (2013.01); *B25B 21/004* (2013.01); *B25F 5/02* (2013.01); *H02K 11/00* (2013.01); *H05K 5/0017* (2013.01)

(58) Field of Classification Search
USPC .......................... 361/728, 752, 807, 809, 810
See application file for complete search history.

(56) References Cited

U.S. PATENT DOCUMENTS

| | | | | |
|---|---|---|---|---|
| 5,251,706 | A * | 10/1993 | Evans | B25B 13/46 173/217 |
| 7,307,230 | B2 * | 12/2007 | Chen | B25B 21/00 200/332.2 |
| 7,874,694 | B2 * | 1/2011 | Li | B25B 23/1425 362/119 |
| 8,251,157 | B2 | 8/2012 | Gray et al. | |
| 8,714,057 | B2 * | 5/2014 | Anjanappa | B25B 23/1425 81/479 |
| 9,457,459 | B2 | 10/2016 | Tadokoro et al. | |
| 9,687,977 | B2 | 6/2017 | Papp | |
| 9,868,200 | B2 | 1/2018 | Lutz et al. | |
| 10,058,989 | B2 * | 8/2018 | Chellew | F21V 5/04 |
| 2002/0035876 | A1 * | 3/2002 | Donaldson, Jr. | B25B 23/1453 73/862.21 |
| 2005/0121209 | A1 * | 6/2005 | Shimizu | B25B 21/00 173/217 |

(Continued)

FOREIGN PATENT DOCUMENTS

WO    2018065855    4/2018

OTHER PUBLICATIONS

Combined Search and Examination Report for corresponding Application No. GB2112103.3 dated Feb. 17, 2022, 9 pages.

*Primary Examiner* — Hung S. Bui
(74) *Attorney, Agent, or Firm* — Seyfarth Shaw LLP

(57) ABSTRACT

A printed circuit board (PCB) for motor and display control of a tool. The PCB is disposed within a housing portion of the tool substantially perpendicular to a display assembly of the tool. The PCB includes integrated switches adapted to engage corresponding buttons of the display assembly. The housing portion and display assembly including features to restrict movement of the PCB relative to the housing portion.

23 Claims, 4 Drawing Sheets

(56) References Cited

U.S. PATENT DOCUMENTS

| | | | |
|---|---|---|---|
| 2011/0284255 A1* | 11/2011 | Ookubo | H02P 27/08 173/109 |
| 2014/0116737 A1 | 5/2014 | Iwata et al. | |
| 2015/0231778 A1 | 8/2015 | Borst | |
| 2019/0190436 A1 | 6/2019 | Choate | |
| 2019/0217460 A1 | 7/2019 | Mahalingappa et al. | |
| 2019/0275647 A1 | 9/2019 | Silha et al. | |

* cited by examiner

PCB WITH INTEGRATED SWITCHES

TECHNICAL FIELD OF THE INVENTION

The present invention relates generally to a printed circuit board (PCB) for motor and display control of a hand tool.

BACKGROUND OF THE INVENTION

Hand tools, such as motorized ratchet wrenches and drivers, are commonly used in automotive, industrial, and household applications to tighten and untighten work pieces, such as threaded fasteners, and to apply a torque and/or angular displacement to a work piece, for example. Hand tools, such as power ratchets and drivers, generally include a motor contained in a housing, along with other components such as switches, printed circuit boards (PCBs), and a power source (e.g., battery), for example. Accordingly, housings of the hand tools require space to accommodate all the components needed to operate these tools, especially for hand tools that use brushless DC electric motors. Adding the additional electronics that brushless DC electric motors require can be difficult because of space constraints, especially when a display and corresponding display control buttons are also necessary. Typically, the display control buttons for selecting features in the display engage switches disposed on a separate circuit board from the motor control circuit board. The tool thus must include additional wiring and structures to hold the display circuit board in position adjacent to the display control buttons.

SUMMARY OF THE INVENTION

The present invention relates broadly to a printed circuit board (PCB) for motor and display control of a hand tool. The display assembly includes buttons and a display, such as an LCD. The display and buttons are shaped to correspond with external geometry of the tool housing. The PCB is disposed substantially perpendicular to the display assembly in the tool housing and has a cross-sectional shape that substantially corresponds with the internal geometry of the tool housing. The PCB includes one or more switches disposed on an edge of the PCB to be engaged by the buttons. By positioning the PCB perpendicular to the display assembly and including switches on the edge thereof, excessive wiring is eliminated, and additional structures to hold the switches in position are no longer needed.

In an embodiment, the present invention broadly comprises a tool. The tool includes a motor and a display assembly disposed in a housing portion. The tool further includes a printed circuit board (PCB) disposed in the housing portion substantially perpendicular to the display assembly. The PCB including a switch adapted to engage a button of the display assembly.

In another embodiment, the present invention broadly comprises a motorized hand tool comprising a housing portion and a driver portion. The hand tool including a display assembly disposed in the housing portion and including a display and a button, and a printed circuit board (PCB) disposed in the housing portion substantially perpendicular to the display assembly. The PCB includes a switch adapted to engage the button.

In another embodiment, the present invention broadly comprises a printed circuit board (PCB) adapted to be disposed in a housing portion of a tool substantially perpendicular to a display assembly. The PCB includes a switch adapted to engage a button of the display assembly.

BRIEF DESCRIPTION OF THE DRAWINGS

For the purpose of facilitating an understanding of the subject matter sought to be protected, there are illustrated in the accompanying drawings embodiments thereof, from an inspection of which, when considered in connection with the following description, the subject matter sought to be protected, its construction and operation, and many of its advantages should be readily understood and appreciated.

DETAILED DESCRIPTION OF THE INVENTION

Figure 1:
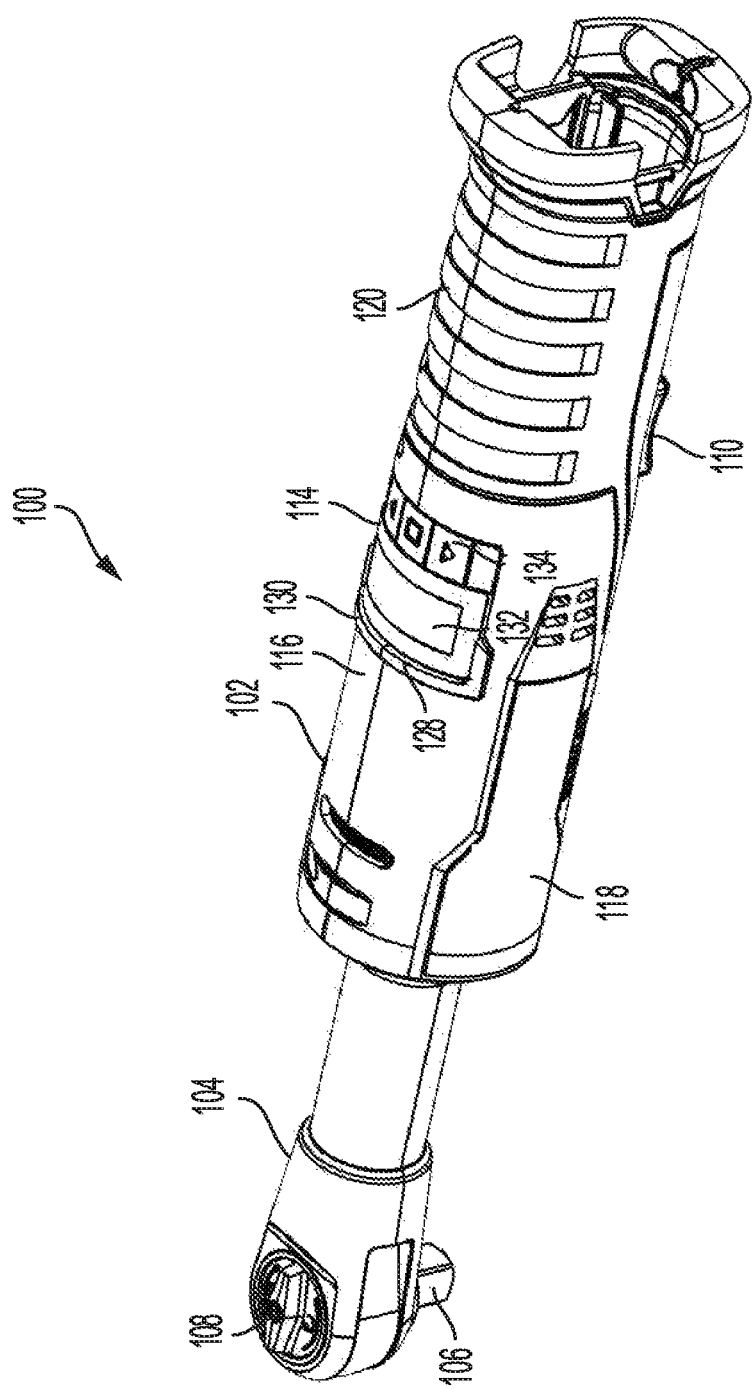
FIG. 1 is a perspective view of an exemplar tool, such as a motorized ratchet tool, including a PCB and display in accordance with an embodiment of the present invention.
Figure 2:
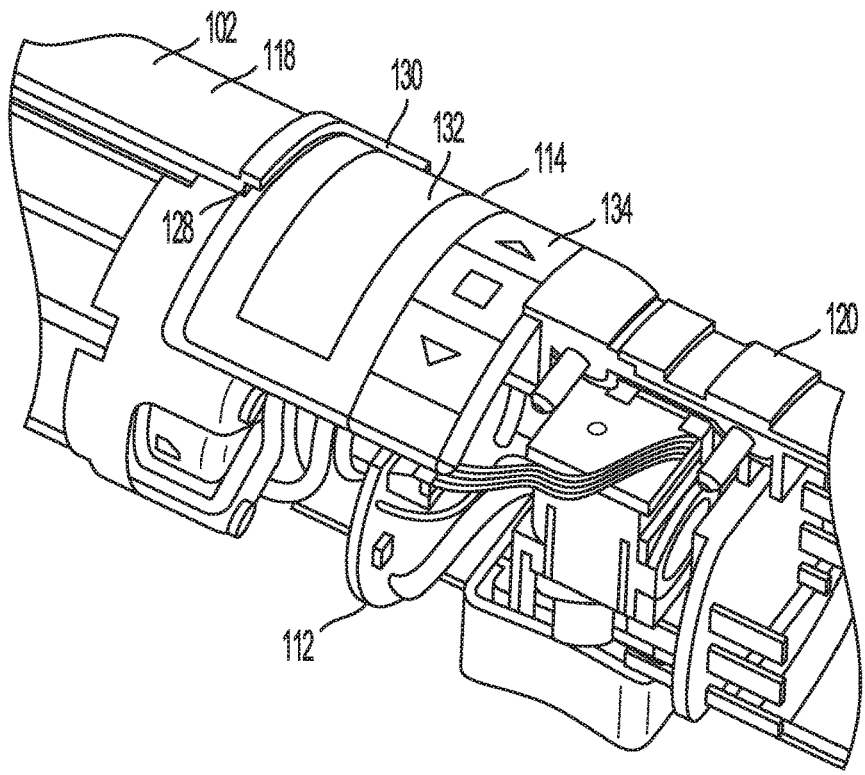
FIG. 2 is a perspective view of the tool of FIG. 1 with one clamshell housing portion removed, showing a display assembly and PCB according to an embodiment of the present invention.
Figure 3:
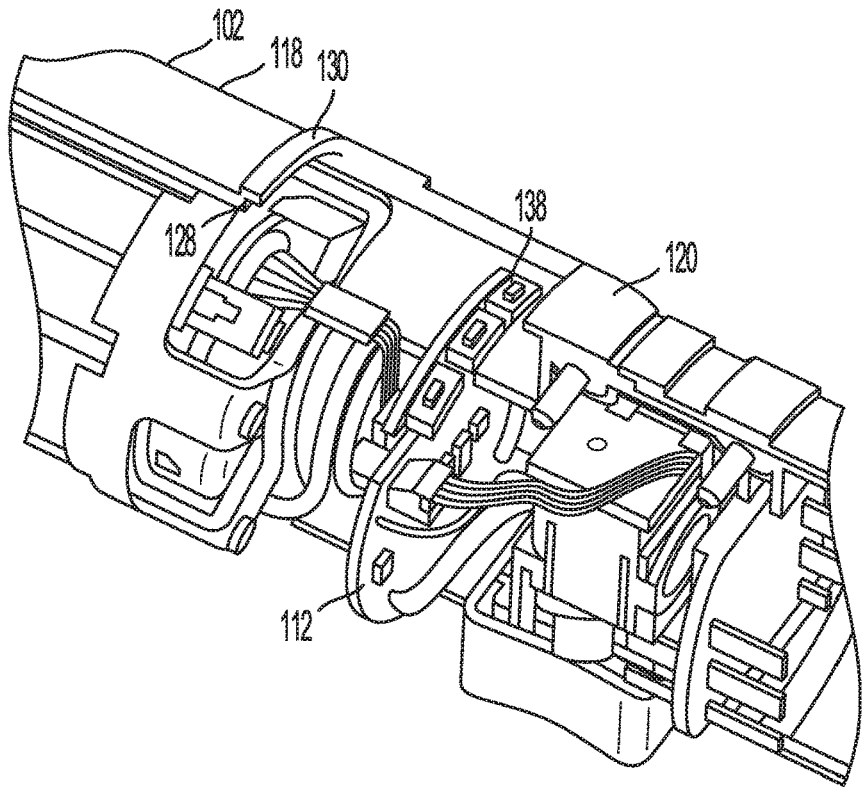
FIG. 3 is a perspective view of the tool of FIG. 1 with one clamshell housing portion and the display assembly removed, showing a PCB according to an embodiment of the present invention.
Figure 4:
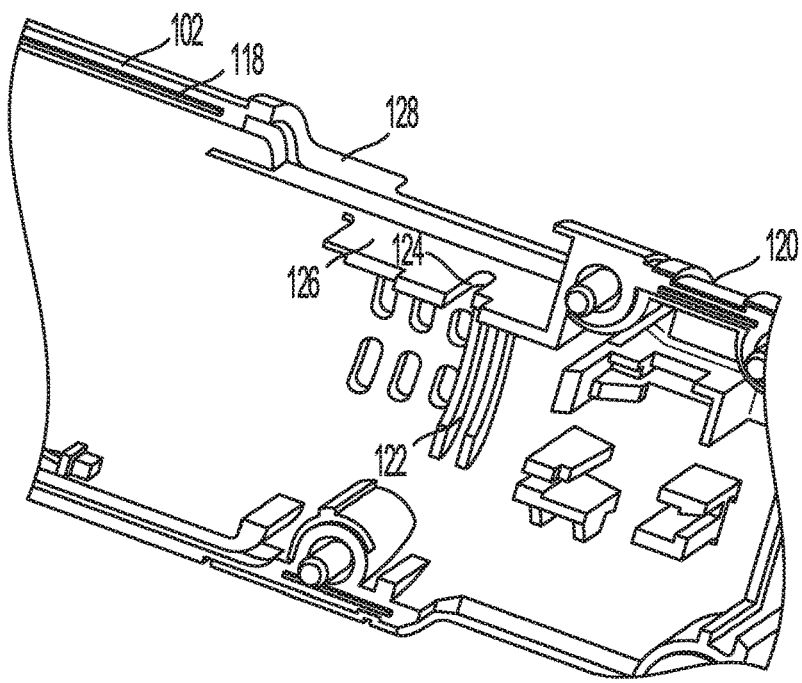
FIG. 4 is a perspective side view of a clamshell housing portion, in accordance with an embodiment of the present invention.
Figure 5:
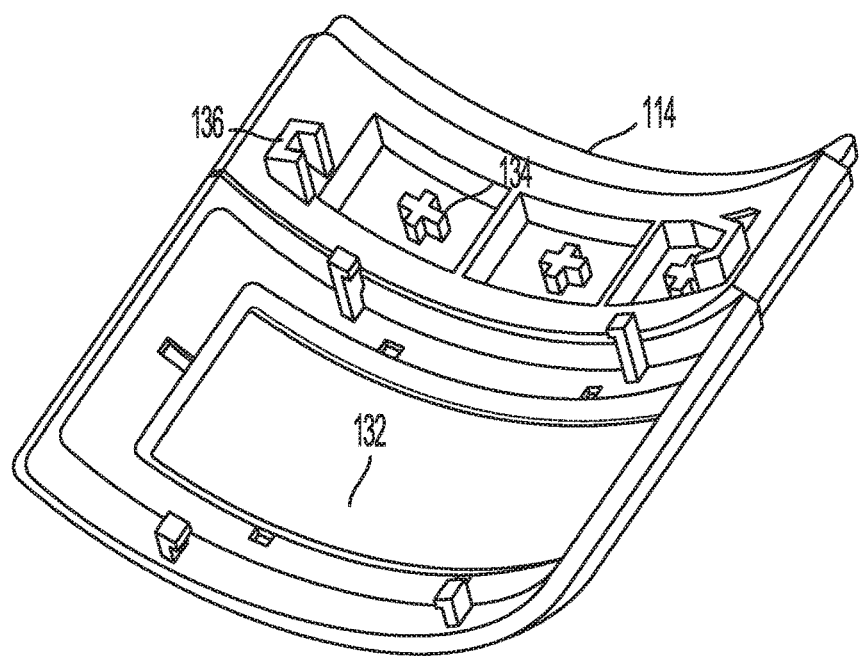
FIG. 5 is perspective side view of an exemplar display assembly, in accordance with an embodiment of the present invention.
Figure 6:
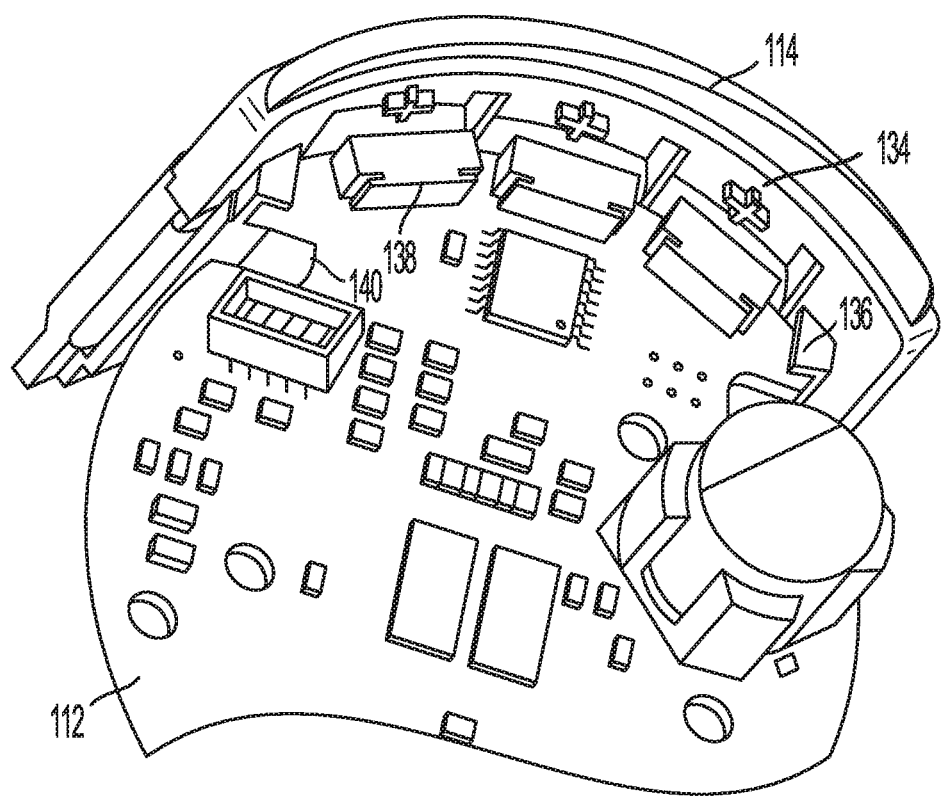
FIG. 6 is a perspective view of a PCB and display assembly, in accordance with an embodiment of the present invention.

While the present invention is susceptible of embodiments in many different forms, there is shown in the drawings, and will herein be described in detail, embodiments of the invention, including a preferred embodiment, with the understanding that the present disclosure is to be considered as an exemplification of the principles of the present invention and is not intended to limit the broad aspect of the invention to any one or more embodiments illustrated herein. As used herein, the term "present invention" is not intended to limit the scope of the claimed invention, but is instead used to discuss exemplary embodiments of the invention for explanatory purposes only.

The present invention broadly includes a motor and display control PCB of a motorized hand tool having a housing, such as, for example, a motorized ratchet tool. The PCB is disposed in the housing and includes integrated switches mounted substantially perpendicular to buttons and a display of a display assembly. The PCB can also include notches that matingly engage ribs of the housing to retain and restrict movement of the PCB therein, once assembled. In an embodiment, the PCB is a motor and display control PCB and requires less wiring and space, compared to current solutions.

Referring to FIGS. 1-6, a tool 100, such as, for example, a motorized ratchet tool, includes a housing portion 102 adapted to be held by a user and a driver portion 104 coupled to the housing portion 102. The driver portion 104 is adapted to apply torque to a work piece and includes a drive lug 106 adapted to engage a tool (e.g., socket or bit) to drive the work piece, for example, in a well-known manner. The drive lug 106 is operatively coupled to and driven by a motor (not shown) via a ratcheting mechanism (not shown) of the driver portion 104 in a well-known manner. The driver portion 104 also includes a selector knob 108 adapted to select a rotational drive direction of the drive lug 106. The driver portion 104 may be a ratchet head of a ratchet tool.

The housing portion 102 encloses one or more of the motor adapted to drive the drive lug 106, a trigger 110 adapted to actuate the motor, a power source (not shown) adapted to provide electrical power for the motor, such as a battery, a PCB 112 (described in more detail below), and a display assembly 114 (described in more detail below). In an embodiment, the housing portion 102 is assembled from two or more matable clamshell housing portions 116, 118 coupled together to cooperatively form the housing. The housing portion 102 may also include a handle portion 120 that a user may grip or hold during operation of the tool 100.

The first clamshell housing portion 116 and second clamshell housing portion 118 are configured to couple together and subsequently house the driver assembly 104 thereby enclosing one or more of the motor, the power source, the PCB 112, and the display assembly 114. When assembled, as shown in FIG. 1, for example, the clamshell housing portions 116, 118, as described below, retain the display assembly 114 and restrict the PCB 112 from moving relative to the clamshell housing portions 116, 118. Each of the clamshell housing portions 116, 118 includes a channel 122 adapted to receive the PCB 112 to restrict axial movement of the PCB 112 relative to the clamshell housing portions 116, 118. Each of the clamshell housing portions 116, 118 includes a radial slot 124 formed in a rib 126 of the clamshell housing portions 116, 118 and adapted to receive the PCB to further restrict axial and rotational movement of the PCB 112 relative to the clamshell housing portions 116, 118. The clamshell housing portions 116, 118 cooperatively form a display opening 128 when coupled together. The display opening 128 includes a peripheral lip 130 disposed at least partially around the perimeter of the display opening 128 to retain the display assembly 114 in the clamshell housing portions 116, 118.

The motor 120 can be, for example, an electric motor electrically coupled to the power source via the trigger 110 and the PCB 112. The power source can be external (e.g., an electrical wall outlet) or internal (e.g., a battery). The trigger 110 can be adapted to cause the motor 120 to be turned ON and OFF. The trigger 110 can be an actuation mechanism that employs a push button actuator or other type of actuator. Alternately, the trigger 110 can be a toggle actuator, a touch sensitive actuator, a slide actuator, or other suitable actuator or device.

The display assembly 114 includes a display 132 adapted to indicate tool information to the user. In an embodiment, the display 132 is an LCD. The tool information can include, for example, a tool status, such as, for example, a power level of the power source, a selected driving direction of the drive lug 106, a power state of the motor, output torque of the tool 100, etc. The display assembly 114 further includes one or more buttons 134 adapted to receive a user input, such as, for example, selecting what is to be shown on the display 132, for selecting tool parameters, such as, for example, the driving direction of the drive lug 106, and/or for otherwise manipulating the display 132 to control the tool 100 and/or parameters of the tool 100.

The display assembly 114 further includes one or more protrusions 136 adapted to align the PCB 112 and the buttons 134, as described below. The buttons 134 and/or the protrusions 136 can be made of an elastomer material, such as, for example, rubber. In an embodiment, the display assembly 114 has a shape that substantially corresponds to external geometry of the housing portion 102. For example, the display assembly 114 is cylindrically shaped.

In an embodiment, the PCB 112 is a motor and display control PCB. For example, the PCB 112 operably couples the buttons 134 to the display 132 and/or the motor and operably couples the trigger 110 and/or the power source to the motor. The PCB 112 is disposed in the housing portion 102 substantially perpendicular to the display assembly 114. In an embodiment, the PCB 112 is disposed between the motor and the power source. The PCB 112 can have a cross-section that substantially corresponds to the internal geometry of the housing portion 102. For example, the PCB 112 has a substantially circular cross-section. The PCB 112 includes one or more switches 138 adapted to engage buttons 134 when actuated by the user. The protrusions 136 are adapted to align the buttons 134 with the switches 138. Although three buttons 134 and switches 138 are illustrated, the invention is not limited as such and any number of buttons 134 and switches 138 can be utilized. The PCB 112 further includes one or more PCB slots 140, each of the slots 140 are adapted to receive a respective rib 126 of the clamshell housing portions 116, 118. Accordingly, the channel 122, the radial slot 124, the protrusions 136, and the PCB slots 140 cooperatively restrict the PCB 112 from axial and rotational movement relative to the housing portion 102.

As discussed above, the aspects of the present invention are described in terms of a motorized ratchet tool, as shown. However, it should be understood that aspects of the present invention could be implanted in other hand tools or implements. For example, and without limitation, the hand tool can be ratchet wrench, open wrench, screw driver, nut driver, or any other tool capable of applying torque to a work piece. The present invention allows for a single PCB to be used for motor and display control of a tool to save space and cost compared to the current art solutions.

As used herein, the term "coupled" can mean any physical, electrical, magnetic, or other connection, either direct or indirect, between two parties. The term "coupled" is not limited to a fixed direct coupling between two entities.

The matter set forth in the foregoing description and accompanying drawings is offered by way of illustration only and not as a limitation. While particular embodiments have been shown and described, it will be apparent to those skilled in the art that changes and modifications may be made without departing from the broader aspects of the inventors' contribution. The actual scope of the protection sought is intended to be defined in the following claims when viewed in their proper perspective based on the prior art.

What is claimed is:

1. A tool having a motor and a button for user input disposed in a housing portion, the tool comprising:
   a printed circuit board (PCB) disposed in a channel formed in the housing portion and being substantially perpendicular to the button, wherein the PCB includes a switch adapted to engage the button.

2. The tool of claim 1, wherein the PCB is a motor and display control PCB.

3. The tool of claim 1, wherein the tool is a motorized ratchet tool.

4. The tool of claim 1, wherein a cross-section of the PCB substantially corresponds to internal geometry of the housing portion.

5. The tool of claim 1, wherein the PCB includes a PCB slot adapted to receive a rib of the housing portion.

6. The tool of claim 1, wherein the PCB is disposed in a radial slot formed in a rib of the housing potion.

7. The tool of claim 1, wherein the housing portion is a clamshell housing having a first clamshell housing portion coupled to a second clamshell housing portion.

8. The tool of claim 1, wherein the button is part of a display assembly that includes a display.

9. A motorized hand tool having a housing portion and a driver portion, comprising:
   a display assembly that includes a display and a button for user input disposed in the housing portion; and
   a printed circuit board (PCB) disposed in the housing portion substantially perpendicular to the button, the PCB including a switch adapted to engage the button, wherein the display assembly includes a protrusion that is adapted to align the switch and the button.

10. The tool of claim 9, wherein the display assembly has a shape that substantially corresponds to external geometry of the housing portion.

11. The tool of claim 10, wherein the display assembly is cylindrically shaped.

12. The tool of claim 9, wherein the button and protrusion are made of an elastomer material.

13. A printed circuit board (PCB) adapted to be disposed in a housing portion of a tool substantially perpendicular to a button for user input, the PCB comprising:
    a switch adapted to engage the button; and
    a PCB slot adapted to receive a rib of the housing portion.

14. The PCB of claim 13, wherein the PCB is adapted to be electrically coupled to a display and a motor of the tool.

15. The PCB of claim 13, wherein a cross-section of the PCB substantially corresponds to internal geometry of the housing portion.

16. The PCB of claim 13, wherein the PCB is adapted to be disposed between a power source and motor of the tool.

17. A tool having a motor and a button for user input disposed in a housing portion, the tool comprising:
    a printed circuit board (PCB) disposed in the housing portion substantially perpendicular to the button, the PCB including a switch adapted to engage the button and a PCB slot adapted to receive a rib of the housing portion.

18. The tool of claim 17, wherein the PCB is a motor and display control PCB.

19. The tool of claim 17, wherein the tool is a motorized ratchet tool.

20. The tool of claim 17, wherein a cross-section of the PCB substantially corresponds to internal geometry of the housing portion.

21. The tool of claim 17, wherein the PCB is disposed in a radial slot formed in a rib of the housing potion.

22. The tool of claim 17, wherein the housing portion is a clamshell housing having a first clamshell housing portion coupled to a second clamshell housing portion.

23. The tool of claim 17, wherein the button is part of a display assembly that includes a display.

* * * * *